United States Patent [19]

Kaszubinski et al.

[11] Patent Number: 4,722,075
[45] Date of Patent: Jan. 26, 1988

[54] EQUALIZED BIASED ARRAY FOR PROMS AND EPROMS

[75] Inventors: Jeffrey K. Kaszubinski, Houston; David D. Wilmoth; Timmie M. Coffman, both of Sugar Land; John F. Schreck, Houston, all of Tex.

[73] Assignee: Texas Instruments Incorporated, Dallas, Tex.

[21] Appl. No.: 786,991

[22] Filed: Oct. 15, 1985

[51] Int. Cl.$^4$ ............................................. G11C 7/00
[52] U.S. Cl. .................................... 365/226; 365/104
[58] Field of Search ............... 365/203, 189, 266, 227, 365/104, 207

[56] References Cited

U.S. PATENT DOCUMENTS

| | | | |
|---|---|---|---|
| 4,301,518 | 11/1981 | Klaas | 365/207 X |
| 4,314,362 | 2/1982 | Klaas et al. | 365/227 |
| 4,344,154 | 8/1982 | Klaas et al. | 365/194 |
| 4,387,447 | 6/1983 | Klaas et al. | 365/203 |

Primary Examiner—Joseph A. Popek
Attorney, Agent, or Firm—Robert Groover, III; John G. Graham; Rodney M. Anderson

[57] ABSTRACT

An array of transistor memory cells of a type in which each cell has a transistor, a ground select switch and a sense amplifier coupling switch. A bias voltage line on which there is established a voltage $V_{BIAS}$ is coupled to each bit line by a bit line transistor whose gate during a read mode is at least about a voltage $V_T$ above $V_{BIAS}$. Similarly, the source of each transistor is coupled to the bias voltage line by a source line transistor whose gate is more than about a voltage $V_T$ about $V_{BIAS}$. The foregoing arrangement ensures that for every non-selected transistor that transistor's source voltage will be equal to its drain voltage so that all non-selected transistors will be substantially non-conducting.

12 Claims, 5 Drawing Figures

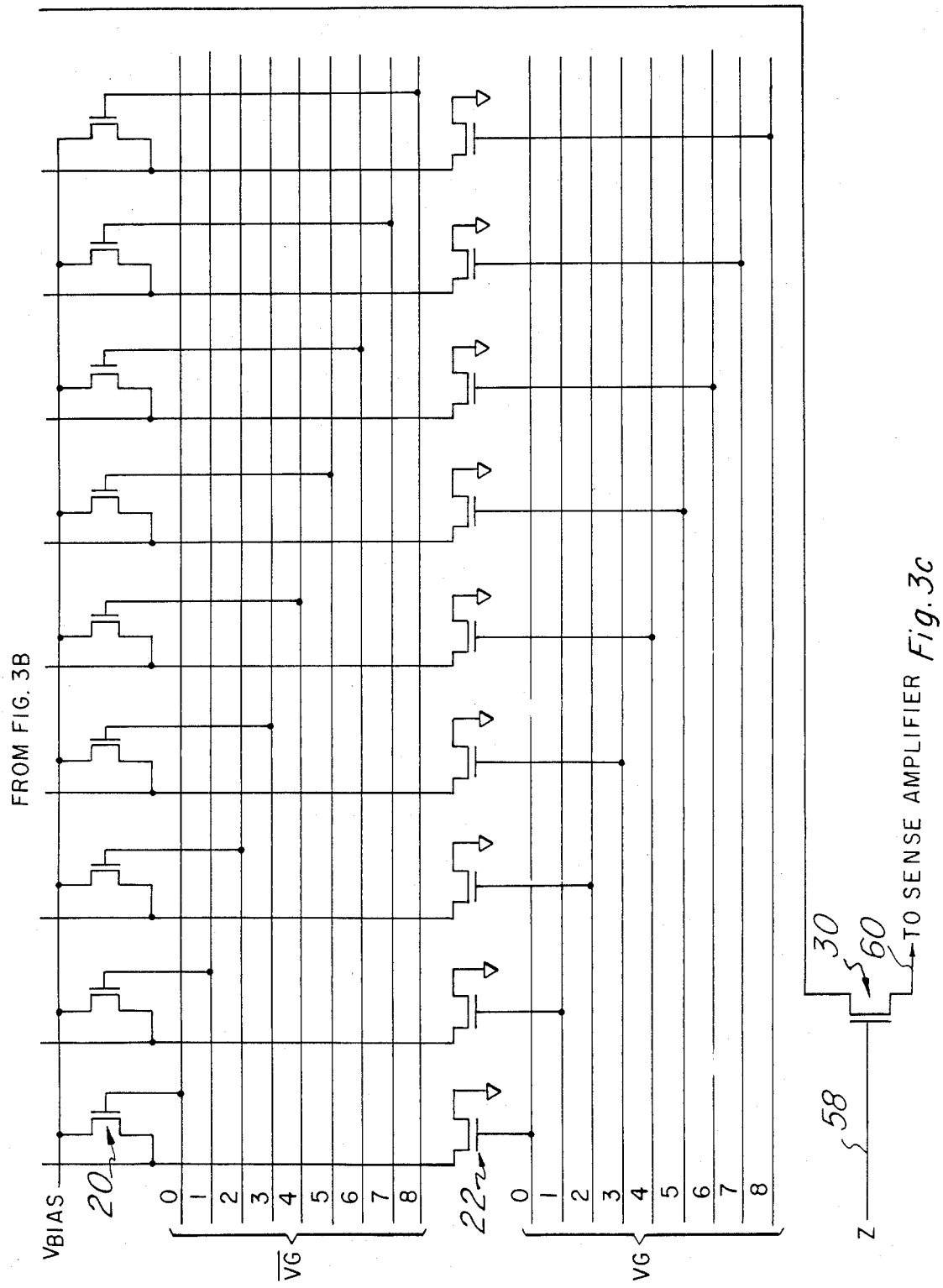

EQUALIZED BIASED ARRAY FOR PROMS AND EPROMS

BACKGROUND

The present invention relates to a method and apparatus for equalizing the biasing of a transistor memory cell during the READ mode across those cells which are non-selected. The invention is applicable to read only memory cells (ROMS), programmable read only memory cells (PROMS) and electrically programmable read only memory cells (EPROMS).

Previously, a reference signal was used to drive independent bit line and array source drivers in order to condition the floating gate transistors for a READ cycle in an array of programmable and electrically programmable read only memory cells. The variation of the voltage level on the drain of the floating gate transistor being read due to threshold voltage or $V_T$ variations of the above-mentioned drivers rendered more uncertain the correct detection of the cell state. In addition, because the driver of the bit line operated in a mode in which its gate voltage was not more than a $V_T$ above its drain, not only was its source voltage $V_T$ dependent, but whenever the bit line voltage rose suddenly, the latter bit line driver became non-conducting and resulted in trapping the bit line voltage in a higher than normal state.

Accordingly, it is a principal object of this invention to provide an improved biasing arrangement for an array of transistor memory cells.

SUMMARY OF THE INVENTION

According to the invention there is provided an array of transistor memory cells of a type in which each cell has a ground select switch and a sense amplifier coupling switch. A bias voltage line on which there is established a voltage $V_{BIAS}$ is coupled to each bit line by a bit line transistor whose gate during a read mode is at least about a threshold voltage $V_T$ above $V_{BIAS}$. Similarly, the source of each transistor is coupled to the bias voltage line by a source line transistor whose gate is coupled to a voltage source VG, which is the complement of a ground select decode signal VG, and which when high is more than a threshold voltage $V_T$ above the voltage of the bias line. The foregoing arrangement ensures that for every non-selected transistor that transistor's source voltage will be equal to its drain voltage so that all non-selected transistors will be non-conducting.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
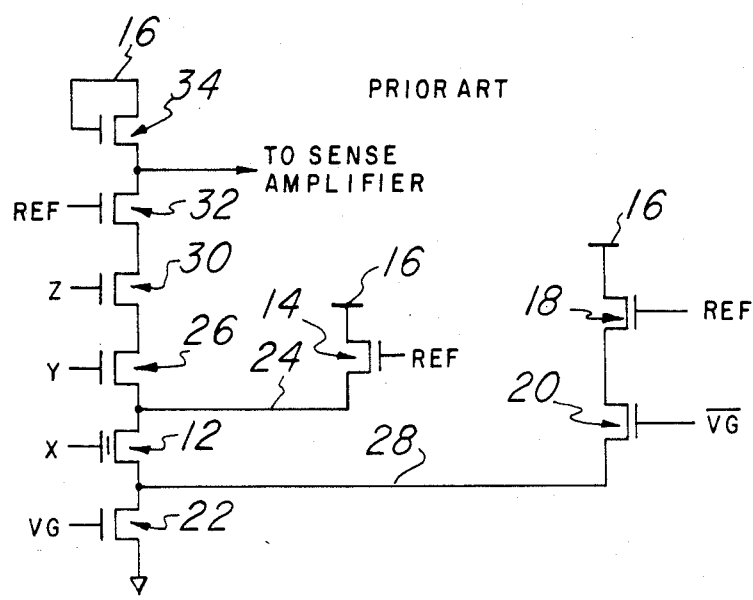
FIG. 1 is a circuit diagram of a prior biasing arrangement for an array of programmable and electrically programmable read only memory cells.

Referring to FIG. 1 there is shown a prior arrangement for biasing an array of memory transistors 12. In this case transistors 12 are each coupled to ground through associated ground select transistors 22. The drain of each transistor 12 is coupled by a bit line 24 to the source-drain path of a bit transistor 14. The other end of of the source drain path of transistor 14 is connected to a supply voltage Vcc 16 while its gate is fed by a reference voltage REF.

The source of each transistor 12 is coupled to an associated source line 28 which connects to a source-drain path of a transistor 20. The other end of the latter path is coupled to supply line $V_{cc}$ 16 by the source drain path of a transistor 18. The gate of a transistor 18. The gate of transistor 18 is driven by the reference voltage REF while that of transistor 20 is driven by the complement $\overline{VG}$ of the ground select decode voltage VG that drives the gate of ground select transistor 22.

Also coupled to bit line 24 are a pair of series connected select transistors 26 and 30 driven by control voltage signals Y and Z, respectively. The source-drain path of transistor 30 connects to a transistor 32 whose gate is driven by the reference voltage REF and the other end of the path being coupled to a transistor 34 connected as a load to supply voltage $V_{cc}$ 16. A sense amplifier (not shown) couples to the junction of transistors 32 and 34 to measure the voltage at that point during a read cycle. The structure, circuit arrangement and operation of the array of memory cells of FIG. 1 is similar to that set forth in U.S. Pat. No. 4,314,362 issued Feb. 2, 1982 to Klaas et al.

Operation of the circuit of FIG. 1 for a read mode involves selection of a particular transistor 12 by application of decode signals X, Y and Z to sets of transistors 12, 26 and 30, respectively. The application of reference voltage REF which is normally about 2 or 3 volts to the gate of transistor 14 causes the latter to conduct and places a voltage equal to REF-$V_T$ on bit line 24. The threshold voltage $V_T$ of transistor 14 is introduced as a variable on bit line 24 since transistor 14 is operating with its gate at a lower voltage than its drain (ie. 2-3 volts versus 5 volts). For a selected transistor 12, ground select transistor 22 is turned on by the application of a decode voltage VG to its gate thereby drawing down source line 28 close to ground. If the selected transistor 12 has not been programmed so that it is in a "1" state then current will flow through transistors 14, 12, and 22 to ground. Similarly, transistor 32 will be made conducting by voltage REF so that current will flow through it and through transistor load device 34 thereby dropping the voltage fed to the sense amplifier (not shown). Since transistor 32 also operates in a $V_T$ dependent mode its conductive state will depend on its value of $V_T$ as compared to that of transistor 14. For a $V_T$ variation of transistor 32 higher than that of transistor 14, it is possible that transistor 32 could be insufficiently conductive.

In order to avoid loading of the bit line 24 during a read cycle by other transistors 12 all source lines 28 other than that of the selected transistor 12 are driven up to the same potential as their corresponding bit lines 24 by transistor 18. In this case the complement $\overline{VG}$ of the ground select decode voltage VG. is applied to the gate of transistor 20 making the latter conduct while reference voltage REF is applied to the gate of transistor 18 also making it conduct. However, since voltage REF is less than the voltage $V_{cc}$ on line 16, the voltage on source line 28 will depend on the value of $V_T$ of transistor 18. If $V_T$ of transistor 18 were significantly higher than that of transistor 14 then it is possible that with transistor 12 in a "1" state transistor 12 could remain conducting sufficiently to load the bit line to which the selected transistor 12 is connected thereby reducing read access time. It will be appreciated that the circuit of FIG. 1 is very dependent on the value of $V_T$ of a number of transistors.

Figure 2:
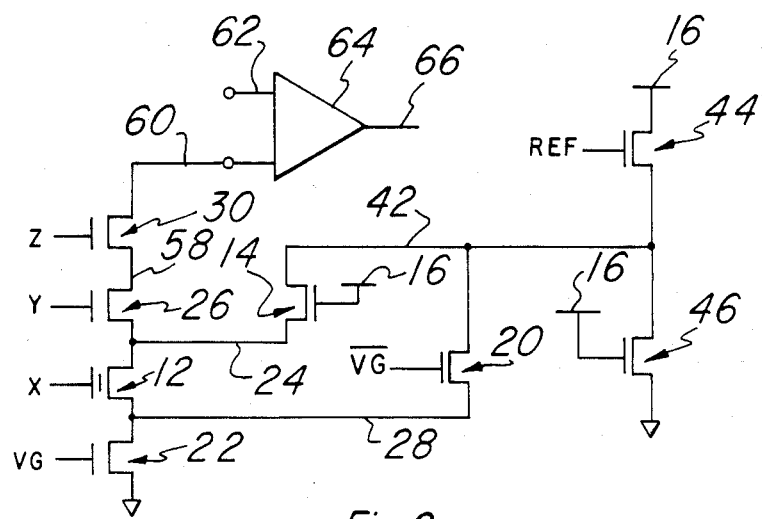
FIG. 2 is a circuit diagram of a preferred embodiment of a biasing arrangement for an array of programmable and electrically programmable read only memory cells.

One way of overcoming the $V_T$ dependence in the read mode is exemplified by the circuit of FIG. 2. In this case both source line 28 and bit line 24 are coupled through transistors 20 and 14 to a a bias line 42 the voltage on which is $V_{BIAS}$. Line 42 is coupled through transistor 44 to supply voltage $V_{cc}$ 16 and through transistor 46 to ground. The gate of transistor 44 is connected to REF while that of transistor 46 is connected to $V_{cc}$ line 16. The gate of transistor 20 is driven by the complement VG of the ground select decode voltage VG, designated VG. In the sensing amplifier circuit non-inverting input 60 of sense amplifier 64 is coupled directly to the drain of transistor 30 while its inverting input is coupled to second reference voltage (not shown) but whose value is approximately half-way between the value on input 60 when associated transistor 12 is non-conducting and the value thereon when transistor 12 is conducting.

In operation decode signal X serves to select a particular row of memory cells 12, transistor 22 provides a virtual ground to a particular column of cells of transistors 12 and decode signals Y and Z connect the selected cell 12 to the sense amplifier 64. At the same time the presence of voltage $V_{cc}$ on line 16 causes transistor 14 to turn on and couple voltage $V_{BIAS}$ on line 42 to the bit line 24. Since voltage $V_{cc}$ is more than a threshold voltage $V_T$ greater than $V_{BIAS}$ the full value of $V_{BIAS}$ will be transmitted to the bit line 24. Moreover, since all of the bit lines 24 are connected to $V_{BIAS}$ there is a high capacitance on line 50 which serves to stabilize it. Even though the value of $V_{BIAS}$ is dependent on the threshold voltage $V_T$ of transistor 44, any variation of this value of $V_T$ affects the voltage on both bit line 24 and source line 28 the same.

The sense amplifier 64 whose non-inverting input 60 is lower than input line 62 when transistor 12 is conducting provides a low output in the latter case. If transistor 12 has been programmed so that it is nonconducting then input 60 will be higher than input 62 and output 66 will go high. The drop in voltage of bit line 24 when transistor 12 is conducting is due to the voltage drop across the channel of transistor 14 when it conducts.

Figure 3A:
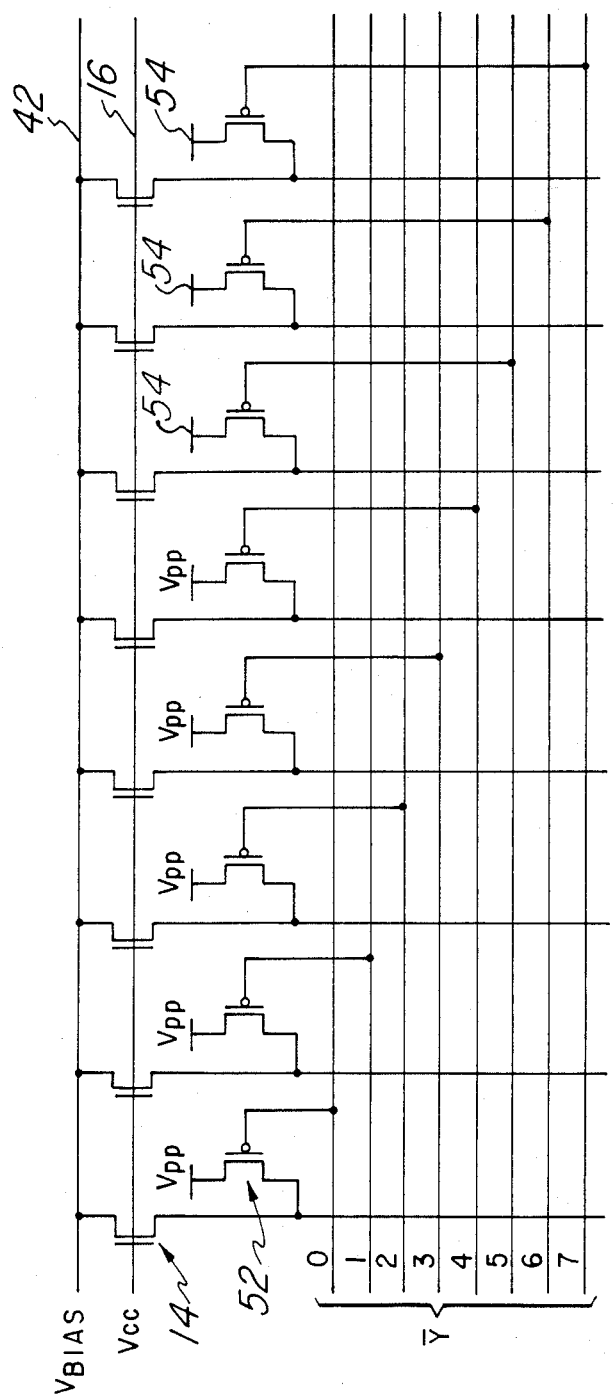
FIG. 3 is a circuit diagram of an array of cells in accordance with the biasing arrangement shown in FIG. 2 above.
Figure 3B:
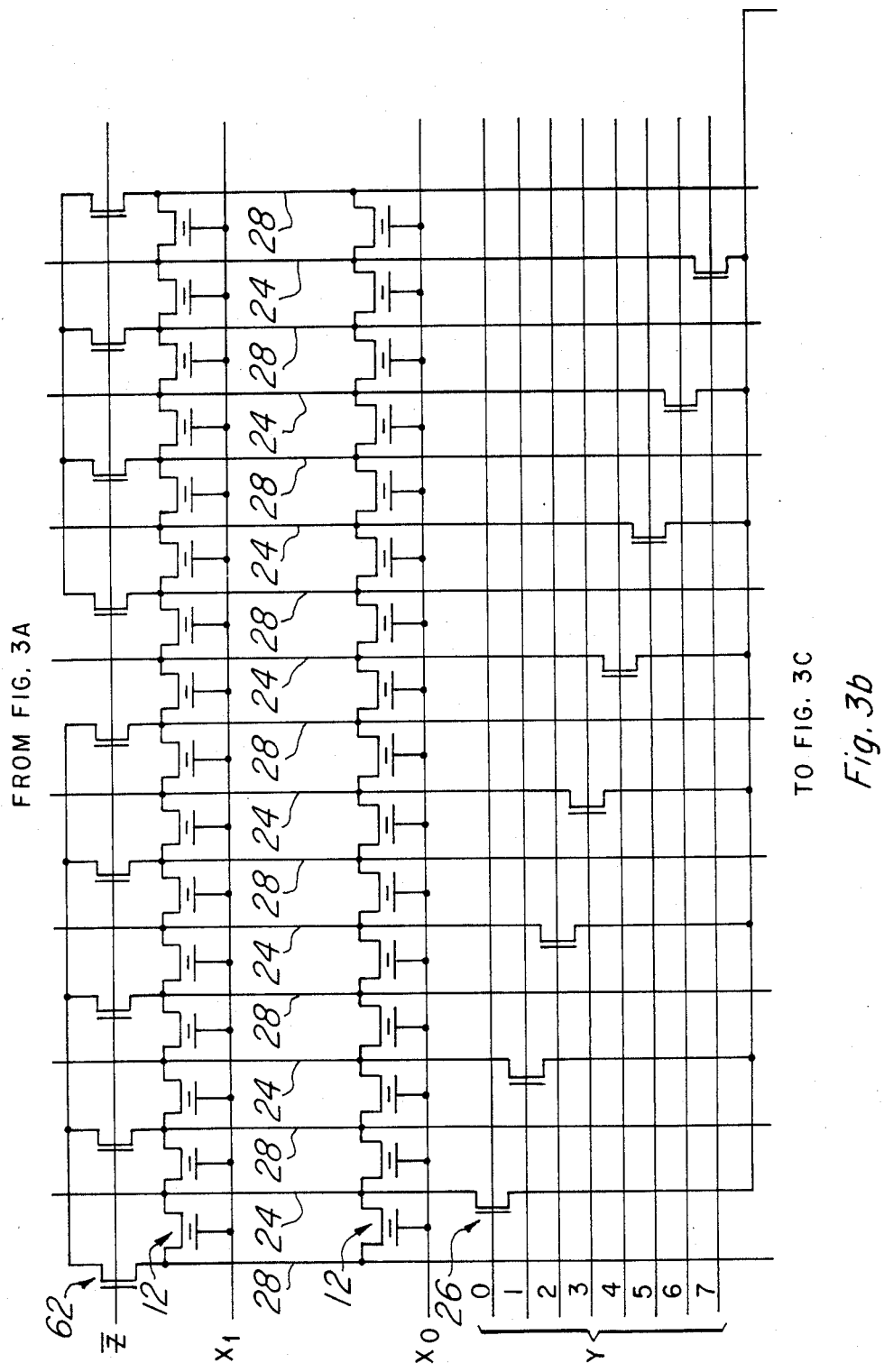

Incorporation of the circuit of FIG. 2 into an array can be understood from the circuit of FIG. 3. In this case only 2 rows of transistors 12 with 16 transistors in each row are shown. The rows are labelled X and $X_1$. Each cell 12 is connected on its source side to a source line 28 and on its drain side to a bit line 24. The remaining components that correspond to those in FIG. 2 are labelled with like reference numerals. It will be observed that there are 8 Y lines, 1 Z line 58 and 9 VG or selection lines for the ground selection transistors 22. Line 16 has a voltage $V_{cc}$ applied to it during a read cycle and is grounded during a program cycle.

Eight $\overline{Y}$ lines are applied to the associated gates of 8 P-channel transistors 52 and result in a high voltage $V_{pp}$ being applied to respective bit lines 24 during a programming mode.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A biasing network for an array of semiconductor memory transistors coupled between associated bit and secure lines, comprising:
   a bias line;
   biasing means coupled to said bias line for biasing the latter to a preselected voltage $V_{bias}$ lower than a supply voltage $V_{cc}$;
   bit means coupled between said bias line and said bit lines for transmitting the voltage $V_{bias}$ during a read cycle to said bit lines;
   source means coupled between said bias line and said source lines for transmitting the voltage $V_{bias}$ to each source line when its corresponding memory transistor is not selected.

2. A biasing network according to claim 1, wherein said bit means is a plurality of bit transistors whose source-to-drain paths are coupled between said bias line and corresponding respective bit lines and whose gates are coupled to the supply voltage $V_{cc}$.

3. A biasing network according to claim 2, wherein said source means is a plurality of source transistors whose source-to-drain paths are coupled between said bias line and corresponding respective source lines and whose gates are coupled to the complement of a ground select control signal operative to make said source transistors conductive when said source lines have a high impedance path to ground.

4. A biasing network according to claim 3, wherein said biasing means is a supply transistor whose source-to-drain path is coupled between the supply voltage $V_{cc}$ and said bias line and whose gate is coupled to a reference voltage REF lower in magnitude than $V_{cc}$.

5. A biasing network according to claim 4, wherein said bias line is coupled to ground through a bleed transistor whose channel impedance when conductive is sufficiently greater than that of said supply transistor when conductive so that the voltage $V_{bias}$ is approximately equal to reference voltage REF less the threshold voltage of said supply transistor and whose gate is connected to the supply voltage $V_{cc}$.

6. A biasing network according to claim 5, including a sense amplifier having one input coupled to said bit lines through a select transistor and another input coupled to a voltage reference source of a value midway between the voltage on said one input when a selected memory transistor is in a programmed state and the voltage on said one input when the selected memory transistor is in a non-programmed state.

7. A method of biasing an array of semiconductor memory transistors of a type having respective bit and source lines, comprising:
   establishing a predetermined bias voltage; and
   transmitting said bias voltage onto both said bit lines and said source lines of non-selected ones of said memory transistors during read modes.

8. A method according to claim 7, wherein said bias voltage is transmitted to said bit lines by a plurality of biasing transistors each having a source-to-drain path connected between said bias voltage and an associated bit line and a gate coupled to a supply voltage so that said bias voltage is more than the threshold voltage of said biasing transistors below the supply voltage.

9. A method according to claim 8, wherein said bias voltage is transmitted to said source lines by a plurality of associated corresponding source transistors each having a source-to-drain path connected between said bias line and an associated source line and each gate of which is coupled to the complement of a ground select decode signal voltage, $\overline{VG}$, such that for non-selected transistors, the signal voltage $\overline{VG}$ is more than a threshold voltage of said source transistors greater than that on said bias line.

10. A method according to claim 9, wherein said bias voltage is established by coupling the source-to-drain path of a bias transistor between the supply voltage and said bias line and its gate to a reference voltage REF whose voltage is below that of the supply voltage.

11. A method according to claim 10, including establishing a bleed path for charge from said bias line to ground for draining charge from said bias line to ground through an impedance much larger than that through said bias transistor by connecting a conducting transistor between said bias line and ground whose channel size is much smaller than that of said bias transistor.

12. A biasing network for an array of non-volatile memory transistors coupled between associated bit and source lines, comprising:

a bias line;

a transistor having a source-to-drain path connected between the bias line and a supply voltage source $V_{cc}$ and a gate coupled to a reference voltage source REF whereby a voltage $V_{bias}$ is established on said bias line;

a bit transistor having a source-to-drain path coupled between said bias line and a corresponding bit line and a gate coupled to a voltage source more than a threshold voltage of the bit transistor greater than $V_{bias}$; and a source transistor having a source-to-drain path coupled between said bias line and a corresponding source line and having a gate coupled to a decoded signal which is active when the corresponding memory transistor is not selected so that when said corresponding memory transistor is not selected during a read cycle, said source transistor transmits the voltage $V_{bias}$ to the corresponding source line.

* * * * *